United States Patent
Kojima

(10) Patent No.: US 10,454,018 B2
(45) Date of Patent: Oct. 22, 2019

(54) ULTRASOUND SENSOR AND DRIVING METHOD THEREFOR

(71) Applicant: Seiko Epson Corporation, Tokyo (JP)

(72) Inventor: Chikara Kojima, Matsumoto (JP)

(73) Assignee: Seiko Epson Corporation (JP)

( * ) Notice: Subject to any disclaimer, the term of this patent is extended or adjusted under 35 U.S.C. 154(b) by 413 days.

(21) Appl. No.: 15/077,132

(22) Filed: Mar. 22, 2016

(65) Prior Publication Data

US 2016/0284972 A1    Sep. 29, 2016

(30) Foreign Application Priority Data

Mar. 24, 2015    (JP) .................................. 2015-061754

(51) Int. Cl.
| | |
|---|---|
| *H01L 41/113* | (2006.01) |
| *H01L 41/09* | (2006.01) |
| *B06B 1/06* | (2006.01) |
| *H01L 41/187* | (2006.01) |
| *G01S 7/521* | (2006.01) |
| *G01S 7/524* | (2006.01) |

(52) U.S. Cl.
CPC ............ *H01L 41/098* (2013.01); *B06B 1/067* (2013.01); *G01S 7/521* (2013.01); *G01S 7/524* (2013.01); *H01L 41/1878* (2013.01)

(58) Field of Classification Search
CPC ......... H01L 41/098; B06B 3/00; B06B 1/067; G01S 7/521
USPC ........................................................ 310/334
See application file for complete search history.

(56) References Cited

U.S. PATENT DOCUMENTS

| | | | |
|---|---|---|---|
| 6,222,304 B1 | 4/2001 | Bernstein | |
| 8,193,685 B2* | 6/2012 | Klee | ..................... B06B 1/0292 310/344 |
| 2007/0200466 A1* | 8/2007 | Heim | ..................... B64C 33/02 310/311 |
| 2010/0302323 A1 | 12/2010 | Yagi et al. | |
| 2011/0220734 A1* | 9/2011 | Yonemura | ............ B41J 2/14233 239/102.2 |

(Continued)

FOREIGN PATENT DOCUMENTS

| | | |
|---|---|---|
| JP | H10-190086 A | 7/1998 |
| JP | 2010-164331 A | 7/2010 |

(Continued)

OTHER PUBLICATIONS

English Translation of JP 2015-147332.*

*Primary Examiner* — Bryan P Gordon
(74) *Attorney, Agent, or Firm* — Harness, Dickey & Pierce, P.L.C.

(57) ABSTRACT

An ultrasound sensor includes a substrate in which a space is formed, a diaphragm provided on the substrate so as to block the space, a piezoelectric element which is provided on the diaphragm and includes a first electrode, a piezoelectric layer, and a second electrode, and an acoustic matching layer provided on a periphery of the piezoelectric element or in the space, in which the diaphragm has a bend in which a region corresponding to the space becomes convex (upwardly convex) to the opposite side to the space in a state where a voltage is not applied to the piezoelectric element, and a relaxation time of the polarization of the piezoelectric layer in the piezoelectric element is a repeating transmission period of the ultrasound sensor or less.

5 Claims, 13 Drawing Sheets

(56) References Cited

U.S. PATENT DOCUMENTS

| | | | |
|---|---|---|---|
| 2012/0206014 A1* | 8/2012 | Bibl | B06B 1/0644 310/331 |
| 2013/0072796 A1* | 3/2013 | Nakamura | A61B 8/4272 600/443 |
| 2013/0308425 A1* | 11/2013 | Nakamura | H01L 41/0825 367/87 |
| 2014/0103781 A1 | 4/2014 | Nakamura et al. | |
| 2014/0187956 A1* | 7/2014 | Rice | B06B 1/0662 600/459 |
| 2015/0054870 A1* | 2/2015 | Konishi | H01L 41/0472 347/9 |
| 2016/0155927 A1 | 6/2016 | Kabasawa et al. | |
| 2016/0329482 A1 | 11/2016 | Nakamura et al. | |

FOREIGN PATENT DOCUMENTS

| | | |
|---|---|---|
| JP | 2010-274620 A | 12/2010 |
| JP | 2014-078906 A | 5/2014 |
| JP | 2014-194992 A | 10/2014 |
| JP | 2015-147332 A | 8/2015 |
| WO | WO-2014-178163 A1 | 11/2014 |

\* cited by examiner

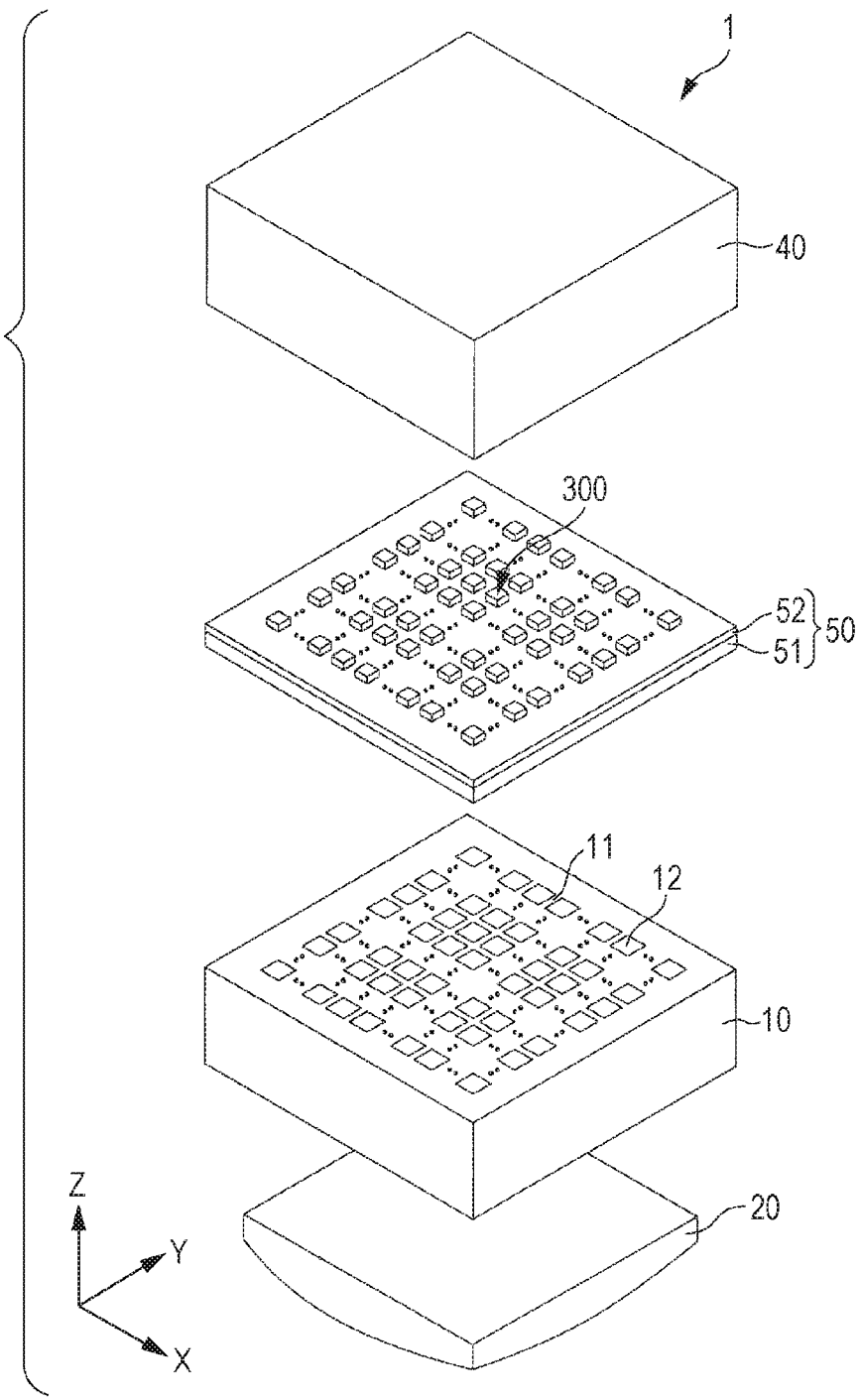

ULTRASOUND SENSOR AND DRIVING METHOD THEREFOR

BACKGROUND

1. Technical Field

The present invention relates to an ultrasound sensor and a driving method therefor.

2. Related Art

In the related art, there are ultrasound sensors provided with a substrate in which a space is formed, a diaphragm provided on the substrate so as to block the space, and a piezoelectric element provided on the diaphragm. It is proposed to configure an ultrasound sensor unit having a base in which an opening is formed, a diaphragm that closes the opening provided on the base, and a piezoelectric element provided on the diaphragm corresponding to the opening (refer to JP-A-2010-164331).

In this type of ultrasound sensor, the diaphragm is displaced and pressure fluctuations accompanying the displacement occur in the medium (acoustic matching layer or air layer) in the space by the piezoelectric element being displaced with the application of a voltage. In so doing, ultrasound (transmitted ultrasound) is transmitted. When ultrasound (reflected ultrasound) reflected by the measurement target is received and pressure fluctuations occur in the medium in the space, the pressure fluctuations are transmitted to displace the diaphragm, and the piezoelectric element is displaced accompanying the displacement of the diaphragm. In so doing, a voltage is obtained from the piezoelectric element. Information pertaining (position, shape or the like) to the measurement target is detected based on the voltage, that is, the waveform of the transmitted ultrasound or the reflected ultrasound.

Although the ultrasound sensor unit in JPA-2010-164331 is a type (a so-called CAV plane-type) in which the opposite side of the diaphragm to the piezoelectric element becomes a pass-through region of the ultrasound, there are also types (a so-called ACT plane-type) of ultrasound sensor in which the piezoelectric element side of the diaphragm becomes the pass-through region of the ultrasound. Ultrasound sensors are classified into a dedicated transmission-type optimized for transmission of ultrasound, a dedicated reception-type optimized for reception of ultrasound, and a transceiving integrated-type optimized for both transmission and reception of ultrasound, and the like.

In any of the types of ultrasound sensor, polarization occurs in the piezoelectric layer by a voltage being applied to the piezoelectric element during transmission of the transmitted ultrasound, and an electromechanical conversion capacity is exhibited according to the state of the polarization. At this time, the higher the state of the compliance (ease of displacement with respect to the stress in the film thickness direction) of the diaphragm, the more advantageous in achieving improvement in the displacement efficiency of the diaphragm.

However, in JP-A-2010-164331, when polarization is caused in the piezoelectric layer, the stress state that acts on the piezoelectric element according to the polarization changes, and, thereafter, there is a possibility for the piezoelectric element and the diaphragm to be maintained in a state of being convexly bent (that is, downwardly convex) to the space side. When the diaphragm is bent downwardly convex, the compliance when the diaphragm is displaced is lower with respect to a case of being bent upwardly convex. In a case where the diaphragm is displaced only in the region in which the compliance of the diaphragm is low, it becomes difficult to achieve improvements in the transmission efficiency and the reception efficiency of ultrasound.

Such a problem is not limited to the ultrasound sensor in JP-A-2010-164331, and is similarly present in ultrasound sensors that use the electromechanical conversion characteristics of the piezoelectric element. That is, this problem is also present in either of the ACT plane-type and the CAV plane-type of ultrasound sensor, and is present in any of the dedicated transmission-type, the dedicated reception-type, and the transceiving integrated-type of ultrasound sensor.

SUMMARY

An advantage of some aspects of the invention is to provide an ultrasound sensor and a driving method therefor capable of achieving improvements in the transmission efficiency and the reception efficiency of the ultrasound sensor.

According to an aspect of the invention, there is provided an ultrasound sensor, including a substrate in which a space is formed; a diaphragm provided on the substrate so as to block the space; a piezoelectric element which is provided on the diaphragm and includes a first electrode, a piezoelectric layer, and a second electrode; and an acoustic matching layer provided on a periphery of the piezoelectric layer or in the space; in which the diaphragm has a bend in which a region corresponding to the space becomes convex to an opposite side to the space in a state in which a voltage is not applied to the piezoelectric element, and a relaxation time of the polarization of the piezoelectric layer in the piezoelectric element is a repeating transmission period of the ultrasound sensor or less.

In the aspect, in either of the CAV plane-type and the ACT plane-type, the diaphragm is convexly bent (that is, upwardly convex) to the opposite side to the space side. When the diaphragm at a predetermined position bent upwardly convex, the compliance when the diaphragm is displaced increases.

According to the aspect, the relaxation time of the polarization of the piezoelectric layer is the repeating transmission period of the ultrasound sensor or less. Therefore, even if the diaphragm is temporarily displaced in the downwardly convex direction by the application of a voltage to the piezoelectric element, the diaphragm quickly returns to upwardly convex. Accordingly, the diaphragm can be displaced so as to pass through the region in which the compliance of the diaphragm is high each time the voltage is applied to the piezoelectric element.

Thus, according to the aspect, improvements in the displacement efficiency of the diaphragm can be achieved, and improvements in the strength of the transmitted ultrasound (transmission efficiency) can be achieved. Improvements in the strength of the reflected ultrasound (reception efficiency) can also be achieved by the amount that improvements in the transmission efficiency of the transmitted ultrasound can be achieved.

It is preferable that the piezoelectric layer is configured from a complex oxide having an $ABO_3$-type perovskite structure that includes bismuth (Bi), iron (Fe), barium (Ba), and titanium (Ti). Accordingly, a piezoelectric layer in which the relaxation time of the polarization is the repeating transmission period of the ultrasound sensor or less becomes easily configured. Accordingly, the ultrasound sensor is easily provided. Additionally, because the piezoelectric layer has a suppressed lead content, the load on the environment can be reduced.

It is preferable that the piezoelectric layer is configured from a complex oxide having a mixed crystal $ABO_3$-type perovskite structure of bismuth ferrate and barium titanate. Accordingly, a piezoelectric layer in which the relaxation time of the polarization is the repeating transmission period of the ultrasound sensor or less becomes easily configured. Accordingly, the ultrasound sensor is easily provided. Additionally, because the piezoelectric layer has a suppressed lead content, the load on the environment can be reduced.

It is preferable that the acoustic matching layer is provided in the space, and the diaphragm has a bend in which the region corresponding to the space becomes convex to the opposite side to the acoustic matching layer in a state where a voltage is not applied to the piezoelectric element. Accordingly, a CAV plane-type ultrasound sensor able to achieve improvements in the transmission efficiency of the transmitted ultrasound and the reception efficiency of the reflected ultrasound can be provided.

It is preferable that the acoustic matching layer is provided on the periphery of the piezoelectric element, and the diaphragm has a bend in which the region corresponding to the space becomes convex to the acoustic matching layer side in a state where a voltage is not applied to the piezoelectric element. Accordingly, an ACT plane-type ultrasound sensor able to achieve improvements in the transmission efficiency of the transmitted ultrasound and the reception efficiency of the reflected ultrasound can be provided.

According to another aspect of the invention, there is provided a driving method of an ultrasound sensor that is provided with a substrate in which a space is formed, a diaphragm provided on the substrate so as to block the space, a piezoelectric element which is provided on the diaphragm and includes a first electrode, a piezoelectric layer, and a second electrode, and an acoustic matching layer provided on a periphery of the piezoelectric layer or in the space, the method including applying a voltage which causes the polarization direction of the piezoelectric layer to be reversed for each driving period of the ultrasound sensor, to drive the piezoelectric element.

According to the aspect, even if the diaphragm is temporarily displaced in the downwardly convex direction by application of a voltage to the piezoelectric element, the diaphragm may return to upwardly convex by applying a voltage which causes the polarization direction of the piezoelectric layer to be reversed. Accordingly, the diaphragm may be displaced so as to pass through the region in which the compliance of the diaphragm is high each time the voltage is applied to the piezoelectric element.

Thus, according to the aspect, improvements in the displacement efficiency of the diaphragm can be achieved, and improvements in the strength of the transmitted ultrasound (transmission efficiency) can be achieved. Improvements in the strength of the reflected ultrasound (reception efficiency) can also be achieved by the amount that improvements in the transmission efficiency of the transmitted ultrasound can be achieved.

It is preferable that a voltage in the vicinity of the coercive voltage of the piezoelectric layer is used as the voltage which causes the polarization direction of the piezoelectric layer to be reversed. Thereby, the polarization of the piezoelectric layer can be reliably reduced. Thus, the driving method of the ultrasound sensor can be reliably provided.

BRIEF DESCRIPTION OF THE DRAWINGS

The invention will be described with reference to the accompanying drawings, wherein like numbers reference like elements.

FIG. 2 is an exploded perspective view illustrating a configuration example of the ultrasound sensor.

DESCRIPTION OF EXEMPLARY EMBODIMENTS

Figure 1A:
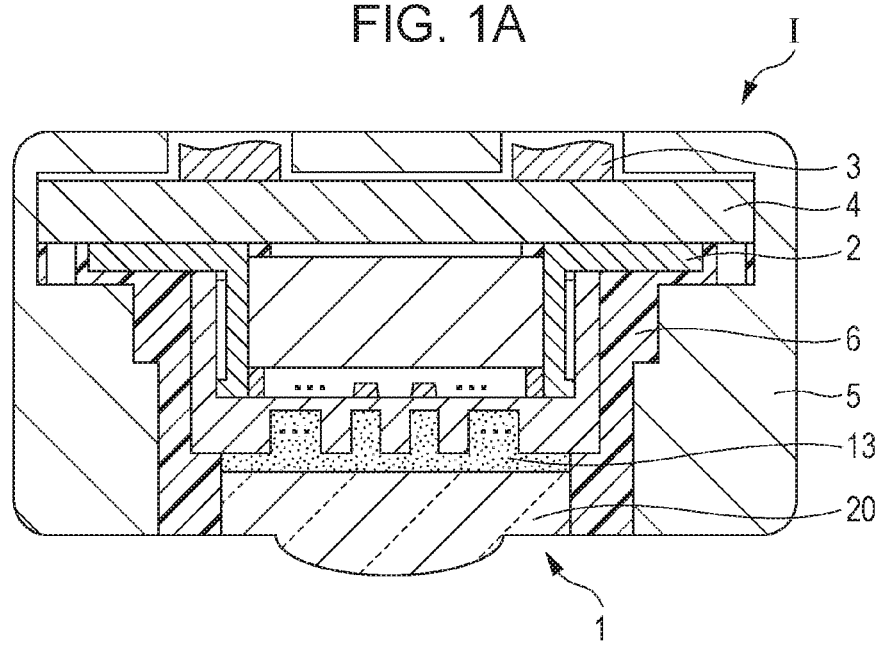
FIGS. 1A and 1B are diagrams illustrating a configuration example and an operation of an ultrasound device.

Below, embodiments of the invention will be described with reference to the figures. The descriptions below show one form of the invention, and arbitrary modifications are possible within the scope of the invention. In each drawing, the same members are given the same reference numerals, and description thereof will not be provided, as appropriate.

Embodiment 1

Figure 1B:
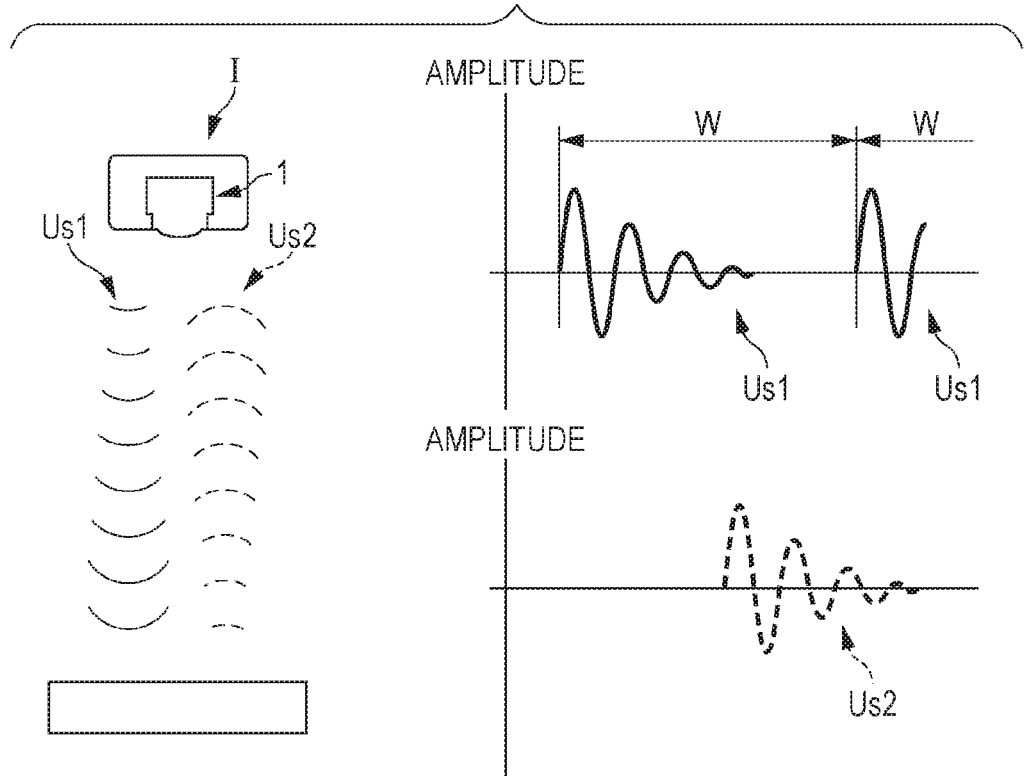

FIGS. 1A and 1B are diagrams illustrating an ultrasound device to which the ultrasound sensor is mounted. FIG. 1A is cross-sectional view illustrating a configuration example of the vicinity of the ultrasound sensor. FIG. 1B is a schematic drawing illustrating the operation of the ultrasound sensor.

The ultrasound probe I is configured provided with a CAV plane-type ultrasound sensor 1, a flexible printed substrate (FPC substrate 2) connected to the ultrasound sensor 1, a cable 3 drawn out from an apparatus terminal (not shown), a relay substrate 4 that intermediates between the FPC substrate 2 and the cable 3, a housing 5 that protects the ultrasound sensor 1, the FPC substrate 2, and the relay substrate 4, and a waterproof resin 6 filled between the housing 5 and the ultrasound sensor 1, and the like.

The ultrasound sensor 1 is configured as a transceiving integrated-type. In the ultrasound sensor 1, the transmitted ultrasound Us1 is transmitted through the acoustic matching layer 13 and the lens member 20 according to the repeating transmission period Tc (refer to FIG. 6 and the like, below, abbreviated to "repeating transmission period") of the ultrasound sensor 1. While the transmitted ultrasound Us1 is transmitted at predetermined intervals W, the reflected ultrasound Us2 reflected from the measurement target is received through the acoustic matching layer 13 and the lens member 20. Information (such as position or shape) pertaining to the measurement target is detected in the device terminal of the ultrasound probe I on the basis of the waveform signal of the transmitted ultrasound Us1 and the reflected ultrasound Us2.

According to the ultrasound sensor 1, it is possible to achieve improvements in the transmission efficiency of the transmitted ultrasound Us1 and the reception efficiency of the reflected ultrasound Us2, as described later. Accordingly, the ultrasound device attains superior detection sensitivity by mounting the ultrasound sensor 1. The invention is not limited to a CAV plane-type and can also be applied to an ACT plane-type. The invention is not limited to a transceiving integrated-type, and can also be applied to a dedicated transmission-type or a dedicated reception-type. The ultrasound device to which the ultrasound sensor 1 is mountable is not limited to the ultrasound probe I.

Figure 3:
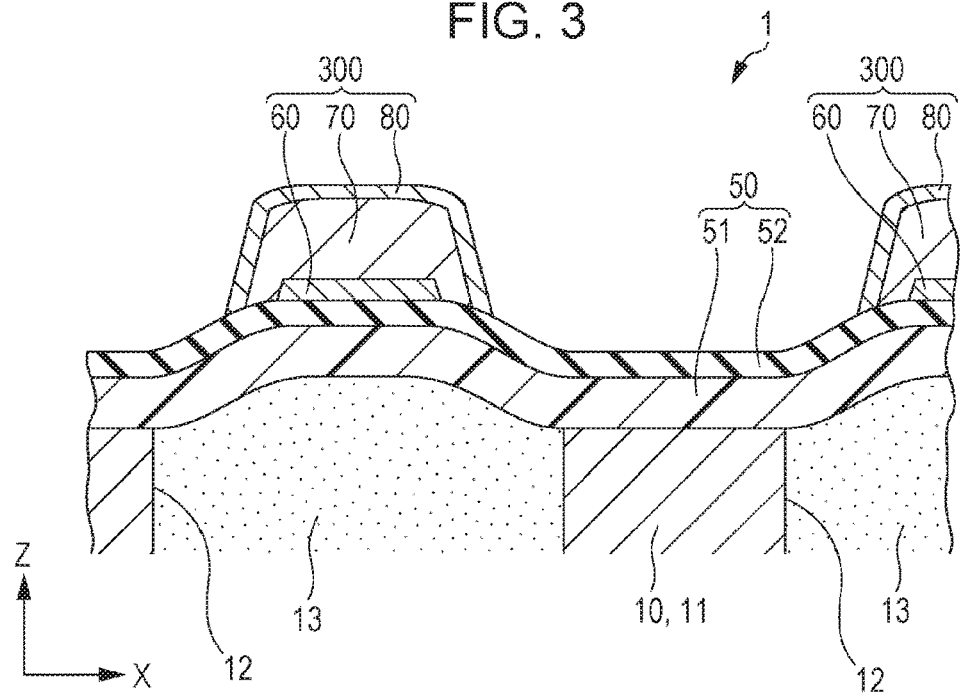
FIG. 3 is cross-sectional view illustrating a configuration example of the ultrasound sensor.

FIG. 2 is an exploded perspective view illustrating a configuration example of the ultrasound sensor. FIG. 3 is cross-sectional view illustrating a configuration example of the substrate, diaphragm, and piezoelectric element of the ultrasound sensor. When the substrate of the ultrasound sensor follows the XY plane formed by the X axis and the Y axis, the cross-section in FIG. 3 follows the XZ plane formed by the X axis and the Z axis. Hereafter, the X axis is referred to as the first direction X, the Y axis as the second direction Y and the Z axis as the third direction Z.

The ultrasound sensor 1 is configured including an ultrasound sensor element, the acoustic matching layer 13, and the lens member 20. The ultrasound sensor element is configured including a substrate 10, a diaphragm 50, and a piezoelectric element 300.

A plurality of dividing walls 11 is formed on the substrate 10. The substrate 10 is partitioned into a plurality of spaces 12 by the plurality of dividing walls 11. It is possible to use a Si single crystal substrate as the substrate 10. The substrate 10 is not limited to the above examples, and an SOI substrate, a glass substrate, or the like may be used.

A space 12 is formed so as to penetrate the substrate 10 in the third direction Z. A plurality of rows of spaces 12 is formed in the first direction X and in the second direction Y. The space 12 has a square-shape (a ratio of the lengths in the first direction X and the second direction Y of 1:1) when seen from the third direction Z.

The arrangement and shape of the spaces 12 can be variously modified. For example, a plurality of rows of spaces 12 may be formed linearly, that is only in the first direction X or in the second direction Y. There may also be only one space 12 in the entire ultrasound sensor 1. The space 12 may further have a rectangular shape (a ratio of the lengths in the first direction X and the second direction Y of other than 1:1) when seen from the third direction Z.

The diaphragm 50 is provided on the substrate 10 so as to block the space 12. The diaphragm 50 is configured by an elastic film 51 formed on the substrate 10 and an insulating layer 52 formed on the elastic film 51. The elastic film 51 is formed from silicon dioxide ($SiO_2$) or the like, and the insulating layer 52 is formed from zirconium oxide ($ZrO_2$) or the like. The elastic film 51 may also not be a separate member to the substrate 10. A portion of the substrate 10 may be worked to be thin and the thin portion may be used as the elastic film.

The diaphragm 50 includes a bend in which a region corresponding to the space 12 becomes convex (that is, upwardly convex) to the opposite side to the space 12 in a state where a voltage is not applied to the piezoelectric element 300. The ultrasound sensor 1, in particular, the piezoelectric element 300 is configured so that the diaphragm 50 has such a bend. In the specification, being convex to the opposite side to the space is expressed as "upwardly convex". Being convex to the space side is expressed as "downwardly convex". Although the configuration in the vicinity of the piezoelectric element differs according to the type of the ultrasound sensor, as long as the ultrasound sensor is provided with a piezoelectric element on the side facing the space of the diaphragm, "upwardly convex" and "downwardly convex" are interpreted as above in any type.

The region corresponding to the space 12 of the diaphragm 50 is a region in which vibration occurs due to the displacement of the piezoelectric element 300. When a voltage is applied to the piezoelectric element 300, vibrations occur in the region. Pressure fluctuations occur in the medium (acoustic matching layer 13) in the space 12 due to the vibrations, and transmitted ultrasound Us1 is transmitted according to the pressure fluctuations. In other words, the repeating transmission period Tc in the specification corresponds to the period of the pressure fluctuations in the space 12 occurring when the diaphragm 50 is displaced. The repeating transmission period Tc also corresponds to the period of the vibrations of the diaphragm occurring according to the displacement of the piezoelectric element 300.

An enclosure plate 40 is provided on the opposite side to the space 12 of the diaphragm 50. The enclosure plate 40 is provided so as to cover the piezoelectric element 300 and the space while maintaining the space in the region (region including the upper and side surfaces of the piezoelectric element 300) on the periphery of the piezoelectric element 300. The space enclosed by the enclosure plate 40 may be an air layer or may be a resin layer. The space may be not sealed. It is possible for the enclosure plate 40 to be configured using an Si-based material similarly to the substrate 10, the diaphragm 50, and the like.

The piezoelectric element 300 is provided on the diaphragm 50. The piezoelectric element 300 is provided at a position corresponding to the space 12 of the diaphragm 50. The piezoelectric element 300 is configured including a first electrode 60 with a length of approximately 0.2 µm, a piezoelectric layer 70 with a thickness of approximately 3.0 µm or less, and preferably approximately 0.5 µm to 1.5 µm, and a second electrode 80 with a thickness of approximately 0.05 µm. The first electrode 60 and the second electrode 80 are electrically connected to a driving circuit (not shown). A voltage is applied to the piezoelectric element 300 by an electrical signal (driving signal) being input from the driving circuit to the first electrode 60 and the second electrode 80.

A part in which the piezoelectric element 300 and the diaphragm 50 in which displacement occurs due to the driving of the piezoelectric element 300 are matched is referred to as an actuator device. In the embodiment, at least the diaphragm 50 and the first electrode 60 are displaced according to the displacement of the piezoelectric layer 70. That is, in the embodiment, at least the diaphragm 50 and the first electrode 60 substantially have a function as a diaphragm. However, only the first electrode may function as the diaphragm 50, without providing either one or both of the elastic film 51 and the insulating layer 52. In a case of directly providing the first electrode 60 on the substrate 10, it is preferable that the first electrode 60 is protected by an insulating protective film or the like.

Although not shown in the drawings, another layer may be provided between the piezoelectric element 300 and the diaphragm 50. For example, an adhesive layer for improving the adhesiveness may be provided between the piezoelectric element 300 and the diaphragm 50. It is possible to configure such an adhesive layer from a titanium oxide ($TiO_x$) layer, a titanium (Ti) layer, a silicon nitride (SiN) layer, or the like.

The piezoelectric element 300 is present in the region inside the space 12 when seen from the third direction Z. That is, the piezoelectric element 300 is shorter in either of the first direction X and the second direction Y than the space 12. However, a case where the piezoelectric element 300 is longer in the first direction X than the space 12 and a case where the piezoelectric element 300 is longer in the second direction Y than the space 12 are included in the invention.

The piezoelectric element 300 may be configured optimized for the transmission only of ultrasound, may be configured optimized for the reception only of ultrasound, or may be configured optimized for both the transmission and reception of ultrasound. Although the ultrasound sensor 1 is configured as a transceiving integrated-type, the invention is also applicable to any of a dedicated transmission-type, a dedicated reception-type, a transceiving integrated-type, and the like. The invention can be designed so as to have a high detection sensitivity according to the CAV-type, the AVT-type, the dedicated transmission-type, the dedicated reception-type, the transceiving integrated-type, and the like.

In the piezoelectric element 300, the piezoelectric layer 70 is interposed by the first electrode 60 and the second electrode 80. The material of the first electrode 60 and the second electrode 80 is not limited, as long as it is a material having conductivity. Examples of the material of the first electrode 60 and the second electrode 80 include metal materials, tin oxide-based conductive materials, lead oxide-based conductive materials, and conductive oxide materials. The metal material is platinum (Pt), iridium (Ir), gold (Au), aluminum (Al), copper (Cu), titanium (Ti), stainless steel, and the like. The tin oxide-based conductive material is indium tin oxide (ITO), fluorine-doped tin oxide (FTC)), and the like. The conductive oxide material is a zinc oxide-based conductive material, strontium ruthenate ($SrRuO_3$), lanthanum nickelate ($LaNiO_3$), element-doped strontium titanate, and the like. The material of the first electrode 60 and the second electrode 80 is not limited to the above materials. The material of the first electrode 60 and the second electrode 80 may be a conductive polymer.

The piezoelectric layer 70 is configured by patterning for each space 12. The piezoelectric layer 70 has an electromechanical conversion capacity. When a voltage is applied to the piezoelectric element 300, polarization occurs in the piezoelectric layer 70, thereby displacing the piezoelectric element 300 and the diaphragm 50. When the piezoelectric element 300 displaces, polarization occurs in the piezoelectric layer 70 to generate a surface charge. The surface charge is detected as a voltage with the driving circuit.

The time that the piezoelectric layer 70 holds the polarization can be regulated by the material that configures the piezoelectric layer 70. The delay time (relaxation time T1, refer to FIG. 6 and the like) until the polarization occurring in the piezoelectric layer 70 substantially disappears can also be adjusted by the material that configures the piezoelectric layer 70. By adjusting the constituent material, it is possible to configure the piezoelectric layer 70 in which the relaxation time T1 of the polarization becomes the repeating transmission period Tc or less.

The piezoelectric layer 70 is configured including a complex oxide having an $ABO_3$-type perovskite structure. Here, a non-lead based material in which the content of lead is suppressed is used as the complex oxide. By using a non-lead based material, the lead content of the piezoelectric layer 70 is suppressed, and it is possible to reduce the load on the environment. Examples of the non-lead based material include complex oxides (BF-BT-based complex oxide) that include bismuth (Bi), iron (Fe), barium (Ba), and titanium (Ti). By using the BF-BT-based complex oxide, it is easy to configure the piezoelectric layer 70 in which the relaxation time T1 of the polarization is the repeating transmission period Tc of the ultrasound sensor 1 or less.

The A site of the $ABO_3$ perovskite structure, that is, an $ABO_3$-type structure is coordinated with 12 oxygen atoms, and the B site is coordinated with 6 oxygen atoms, thereby forming an octahedron. In the BF-BT-based complex oxide, the Bi and Ba are positioned at the A site, and the Fe and the Ti are positioned at the B site.

The BF-BT-based complex oxide is expressed as a complex oxide having a mixed crystal perovskite structure of bismuth ferrate and barium titanate. The complex oxide is also expressed as a solid solution in which the bismuth titanate and the barium titanate are evenly dissolved. Even in a constitution expressed as a mixed crystal or a solid solution, the bismuth titanate and the barium titanate are not independently detected in X-ray diffraction patterns.

The constitution of the BF-BT-based complex oxide is expressed by the following formula (1). Formula (1) is also represented by the following formula (2).

$$(1-x)[BiFeO_3]-x[BaTiO_3] \tag{1}$$

$$(0<x<0.40)$$

$$(Bi_{1-x}Ba_x)(Fe_{1-x}Ti_x)O_3 \tag{2}$$

$$(0<x<0.40)$$

The BF-BT-based complex oxide is not limited to the above constitutions and may include other elements. Examples of the other element include potassium (K), calcium (Ca), strontium (Sr), sodium (Na), lithium (Li), samarium (Sm), or cerium (Ce) substituted for a portion of the A site of the piezoelectric layer 70, or manganese (Mn), zinc (Zn), zirconium (Zr), magnesium (Mg), copper (Cu), aluminum (Al), nickel (Ni), cobalt (Co), or chromium (Cr) substituted for a portion of the B site. Although it is preferable that the BF-BT-based complex oxide does not contain lead, Pb (lead) substituted for a portion of the A site may be included.

By using the complex oxide containing other elements, there are cases where it is possible to achieve improvements in various characteristics. The amount of the other element is 15% or less to the total amount of the elements that is the main component, and preferably 10% or less. Also in cases of including the other elements, it is preferable that the complex oxide is configured so as to include an $ABO_3$-type perovskite structure.

The complex oxide that configures the piezoelectric layer 70 is not limited to only the BF-BT-based complex oxide. The piezoelectric layer 70 may be configured using a complex oxide other than BF-BT-based, or may be configured using the BF-BT-based complex oxide and a complex oxide other than BF-BT-based. In a case of using a complex oxide other than BF-BT-based, if a non-lead based material is used, it is possible to reduce the load on the environment.

Examples of the complex oxide other than BF-BT-based include a BFO-based complex oxide that includes bismuth (Bi), and iron (Fe), and a KNN-based complex oxide that includes potassium (K), sodium (Na), and niobium (Nb). In examples using the BFO-based complex oxide, the Bi is positioned at the A site and Fe at the B site, and the constitutional formula therefor is represented by $BiFeO_3$. In examples using the KNN-based complex oxide, the N and Na are positioned at the A site, and the Nb at the B site, and the constitutional formula therefor is represented by (K, Na)$NbO_3$. The BFO-based complex oxide, the KNN-based complex oxide, and the like are not limited to the above constitutions, and may include other elements. Examples of the other elements are as above.

The constitutional formulae given as examples above are denoted based on stoichiometry. The complex oxide having an $ABO_3$-type perovskite structure also includes complex oxides deviating from the stoichiometric constitution due to loss or excess, and complex oxides in which a portion of the element is substituted with another element. That is, as long as the $ABO_3$-type perovskite structure is obtainable, inevitable deviation of the constitution due to lattice mismatch, oxygen loss, and the like, and partial substitution of the elements is also naturally allowed. However, it is necessary that the piezoelectric layer 70 is configured so that the relaxation time T1 of the polarization becomes the repeating transmission period Tc or less.

Above, the ultrasound sensor element is configured including a space 12 formed in the substrate 10, a diaphragm 50, and a piezoelectric element 300. By further providing the ultrasound sensor element with the acoustic matching layer 13 and the lens member 20, the ultrasound sensor 1 is formed.

The ultrasound sensor 1 is configured as a CAV plane-type. That is, the acoustic matching layer 13 is provided in the space 12. The diaphragm 50 includes a bend in which a region corresponding to the space 12 becomes upwardly convex in a state where a voltage is not applied to the piezoelectric element 300. In the CAV plane-type ultrasound sensor 1, the piezoelectric element 300 is at separated position with respect to the measurement target, compared to the ACT plane-type ultrasound sensor. Accordingly, an ultrasound sensor 1 is formed with a configuration in which it is extremely difficult for moisture from the outside to reach the piezoelectric element 300, and with superior electrical stability during use. Moreover, in a case where the piezoelectric element 300 is a thin film, since it is possible for the handling during manufacturing to also be improved, handling of the ultrasound sensor 1 becomes easy.

The acoustic matching layer 13 has a role of causing the acoustic impedance between the piezoelectric element 300 and the measurement target to change in a step-wise manner. By providing the acoustic matching layer 13, it is possible to prevent the acoustic impedance between the piezoelectric element 300 and the measurement target from suddenly changing, and, as a result, it is possible to prevent the transmission efficiency of the ultrasound from being lowered. Although it is possible for the acoustic matching layer 13 to be configured from a silicone resin or the like, there is no limitation to the above example.

The lens member 20 is provided on the opposite side to the diaphragm 50 of the substrate 10. The lens member 20 has a role of causing transmitted ultrasound or reflected ultrasound to converge. Here, the acoustic matching layer 13 has a function of adhering the lens member 20 and the substrate 10, and the acoustic matching layer 13 is interposed between the lens member 20 and the substrate 10 (dividing wall 11). The lens member 20 can be omitted. The lens member 20 can be substituted with a protective plate or the like that does not have a function of converging the ultrasound.

As outlined above, in the ultrasound sensor 1, a voltage is applied to the piezoelectric element 300 during transmission of the transmitted ultrasound. In so doing, polarization occurs in the piezoelectric layer 70, and the piezoelectric element 300 and the diaphragm 50 are temporarily displaced in the downwardly convex direction. Pressure fluctuations occur in the medium (acoustic matching layer 13) inside the space 12 according to the displacement of the diaphragm 50 at this time. The transmitted ultrasound Us1 is transmitted according to the repeating transmission period Tc of the vibrations at this time. Accordingly, it is possible to achieve improvements in the displacement efficiency of the diaphragm 50 the higher the state of compliance is when the diaphragm 50 is displaced, and it is possible to achieve improvements in the strength (transmission efficiency) of the transmitted ultrasound Us1. If it is possible for improvements in the strength of the transmitted ultrasound Us1 to be achieved, it is possible for improvements in the strength (reception efficiency) of the reflected ultrasound Us2 to be achieved.

Figure 4:
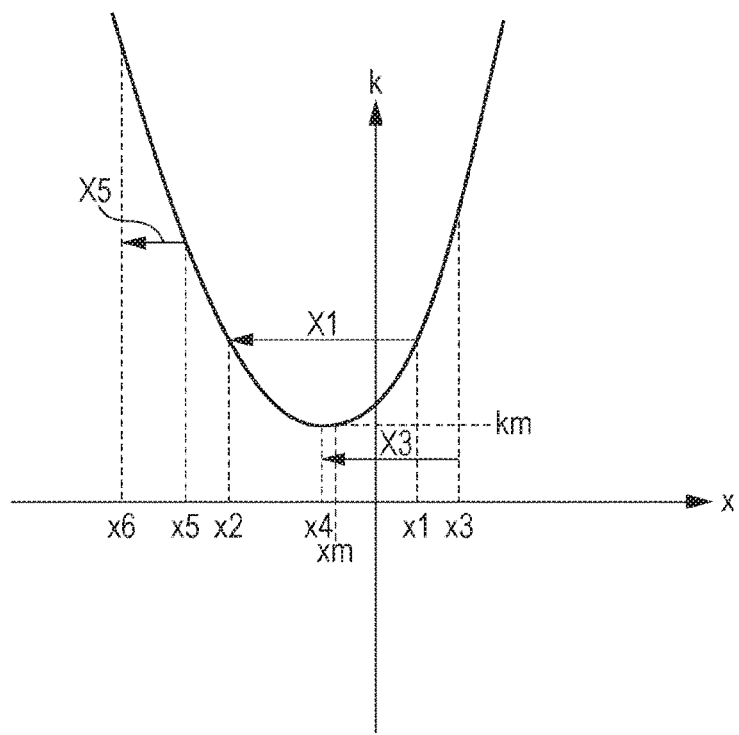
FIG. 4 is a diagram illustrating a relationship between apparent rigidity in the downwardly convex direction of a diaphragm and displacement.

Here, the present inventors discovered that the apparent rigidity k changes when the diaphragm 50 is displaced in the downwardly convex direction according to the initial position of the diaphragm 50. FIG. 4 is a graph illustrating the relationship between the apparent rigidity k in the downwardly convex direction of the diaphragm 50 and the displacement of the diaphragm 50. In the drawing, the range where x is positive indicates that the diaphragm 50 is upwardly convex. The range in which x is negative indicates that the diaphragm 50 is downwardly convex.

The relationship below is present in the ultrasound sensor 1. That is, when a predetermined value xm in the range in which x is negative is attained, the apparent rigidity k attains the minimum value km. According to x increasing or reducing more than the predetermined value xm, the apparent rigidity k increases in the downwardly convex direction of the diaphragm 50 (large amount of energy is necessary to make the diaphragm 50 be displaced in the downwardly convex direction).

When focusing on such a relationship, in a case where the diaphragm 50 is displaced in a range (region where the compliance of the diaphragm 50 is high) where the apparent rigidity k is low, it is possible for more of the energy occurring when the voltage is applied to the piezoelectric layer 70 to be distributed for the displacement of the diaphragm 50. According to the explanation corresponding to FIG. 4, by causing the diaphragm 50 to displace in a range where the apparent rigidity k is small (region where the value on the y-axis is low), even with the same energy, it is possible to ensure greater displacement (ensure a larger movement distance on the x-axis).

In the ultrasound sensor 1, the region of the diaphragm 50 which corresponds to the space 12 has an upwardly convex initial bend of x1 (x1>0≥xm) in a state where a voltage is not applied to the piezoelectric element 300. By applying a voltage to the piezoelectric element 300, it is possible for the diaphragm 50 to be displaced up to x2 (xm>x2). At this time, the displacement X1 (|x1|+|x2|) in a case where the diaphragm 50 is displaced in a range where the apparent rigidity k is low is greater than the displacement X3 (|x3|+|x4|) in the drawings or the displacement X5 (|x5|+|x6|). The displacement X3 (|x3|+|x4|) is the displacement in a case where the diaphragm that includes the predetermined value xm is caused to flex downwardly convex from a state where, although the predetermined value xm is included, the diaphragm is held excessively upwardly convex. The displacement X5 (|X5|+|x6|) is the displacement in a case where the diaphragm is further bent downwardly convex while maintained downwardly convex.

For the diaphragm 50 to be displaced in the range where the apparent rigidity k is low, it is preferable that the center points of the initial position of the diaphragm 50 before displacement (for example, x1 in FIG. 4) and the position of the diaphragm 50 after displacement (for example, x2 in FIG. 4) are the minimum value km of the apparent rigidity k or in the vicinity thereof.

The relationship shown in FIG. 4 is simply an example. Although there are cases where it is possible for the relationship shown in FIG. 4 to be changed according to the configuration or the like of the ultrasound sensor 1, it is also possible for the relationship to be obtained based on advance testing and the like. The invention can be applied to a case where the relationship in which the apparent rigidity k changed when the diaphragm is displaced according to the state of the diaphragm, as long as not departing from the gist of the invention.

Figure 5A:
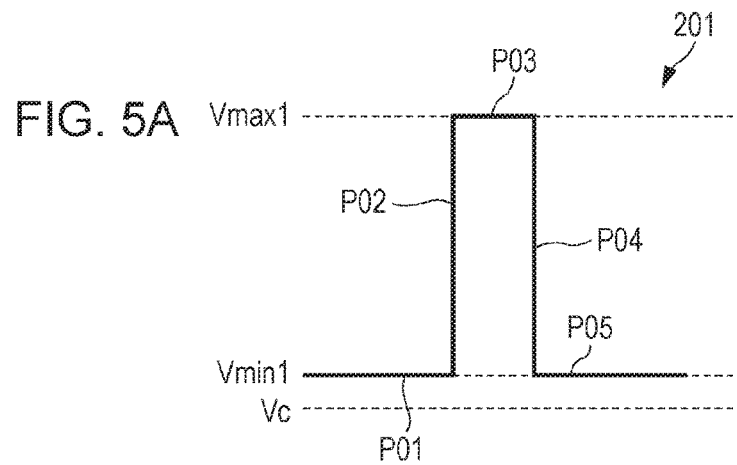
FIGS. 5A to 5C are diagrams illustrating examples of a driving waveform in the ultrasound sensor.
Figure 5B:
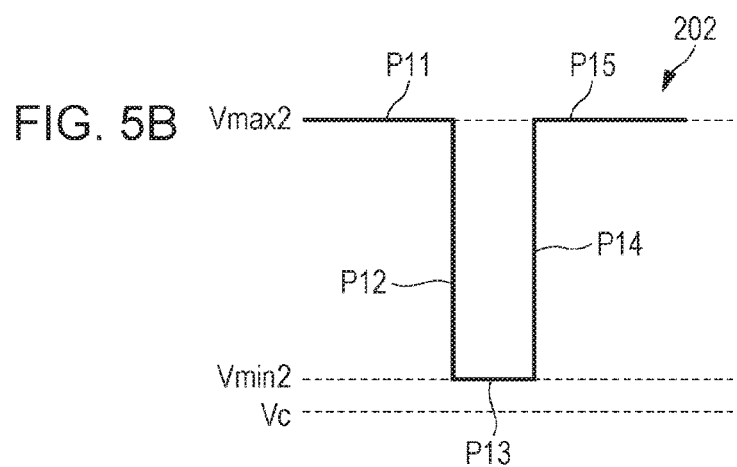
Figure 5C:
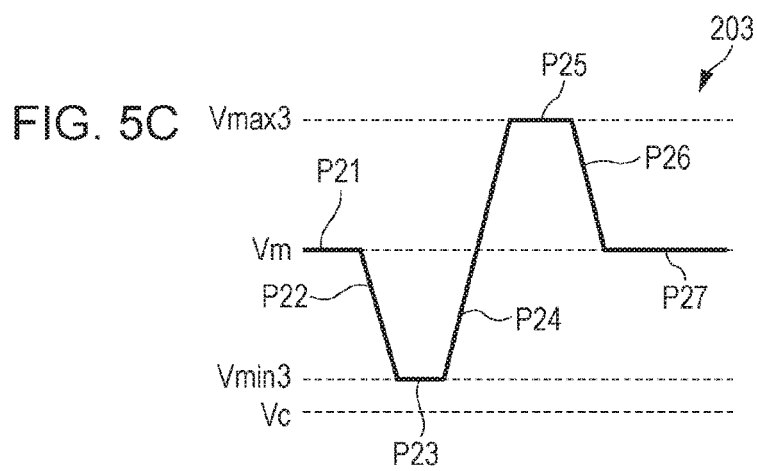

FIGS. 5A to 5C are examples of the driving waveform that represents the driving signal (COM) input to the piezoelectric element 300. FIG. 5A illustrates the driving waveform of a first mode in which the volume of the space 12 is compressed. FIG. 5B illustrates the driving waveform of a second mode in which the volume of the space 12 is compressed, as necessary, and thereafter the volume of the space 12 is decreased after being temporarily expanded. FIG. 5C illustrates the driving waveform of a third mode in which the first and second modes are combined. In each drawing, Vc is the coercive voltage (voltage that provides an electrical field in which the polarization of the piezoelectric layer 70 is zero when the polarization of the piezoelectric layer 70 and the hysteresis loop of the voltage are evaluated).

The driving waveform 201 of the first mode is configured by a step P01 in which the minimum voltage Vmin1 is maintained for a fixed time, a compression step P02 in which the driving voltage V is increased up to the maximum voltage Vmax1, a step P03 in which the maximum voltage Vmax1 is maintained for a fixed time, a step P04 in which the driving voltage V is lowered to the minimum voltage Vmin1, and a step P05 that continues to the next step P01 (Vmax1>Vmin1>Vc).

According to the driving waveform 201, in the compression step P02, the piezoelectric element 300 is displaced in the direction in which the volume of the space is reduced to vibrate the diaphragm 50. In so doing, pressure fluctuations occur in the medium in the space 12, and the transmitted ultrasound Us1 is transmitted.

The driving waveform 202 of the second mode is configured by an expansion step P12 in which the driving voltage V is lowered to minimum voltage Vmin2 after a step P11 in which the maximum voltage Vmax2 is applied, a step P13 in which the minimum voltage Vmin2 is maintained for a fixed time, a compression step P14 in which the driving voltage V is raised to the maximum voltage Vmax2, and a step P15 that continues to the next step P11 (Vmax2>Vmin2>Vc).

According to the driving waveform 202, the piezoelectric element 300 is displaced in the direction in which the volume of the space 12 is increased by the expansion step P12. Next, the piezoelectric element 300 is displaced in the direction in which the volume of the space is reduced by the compression step P14 to vibrate the diaphragm 50. In so doing, pressure fluctuations occur in the medium in the space 12, and the transmitted ultrasound Us1 is transmitted.

The driving waveform 203 of the third mode is configured by a step P21 in which an intermediate voltage Vm is applied, an expansion step P22 in which the driving voltage V is lowered to the minimum voltage Vmin3 that is higher than the coercive voltage Vc of the piezoelectric layer 70 that is has the opposite polarity to the intermediate voltage Vm, a step P23 in which the minimum voltage Vmin3 is maintained for a fixed time, a compression step P24 in which the driving voltage V is raised to the maximum voltage Vmax3 that is greater than the intermediate voltage Vm, a step P25 in which the maximum voltage Vmax3 is maintained for a predetermined time, a step P26 in which the driving voltage V is lowered to the intermediate voltage Vm, and a step P27 that continues to the next step P21 (Vmax3>Vm>Vmin3>Vc).

According to the driving waveform 203, the piezoelectric element 300 is displaced by the expansion step P22 in the direction in which the volume of the space 12 is increased. Thereafter, in the compression step P24, the piezoelectric element 300 is displaced in the direction in which the volume of the space 12 is reduced to vibrate the diaphragm 50. In so doing, pressure fluctuations occur in the medium in the space 12, and the transmitted ultrasound Us1 is transmitted.

With any of the driving waveforms, in the ultrasound sensor 1, the diaphragm 50 is displaced so that the diaphragm 50 has a bend that becomes upwardly convex and passes through a region in which the compliance of the diaphragm 50 is high. The specific value of each voltage of the driving waveform is adjustable, as appropriate, according to the usage of the ultrasound sensor 1. It is possible for the minimum voltage Vmin to be made an extremely small voltage. In this case, the state in which the minimum voltage Vmin is applied to the piezoelectric element 300 is substantially the same as the state in which a voltage is not applied to the piezoelectric element 300.

In FIGS. 5B and 5C from FIGS. 5A to 5C, the volume of the space is expanded in a portion of the steps. In the example of the related art to which the invention is not applied, when the state in which the diaphragm is temporarily bent downwardly convex, the diaphragm does not become upwardly convex by simply reducing the extent to which the diaphragm becomes downwardly convex even if passing through a step in which the volume of the space is expanded. An example of the embodiment corresponding thereto is as in the time chart in FIG. 6.

Figure 6:
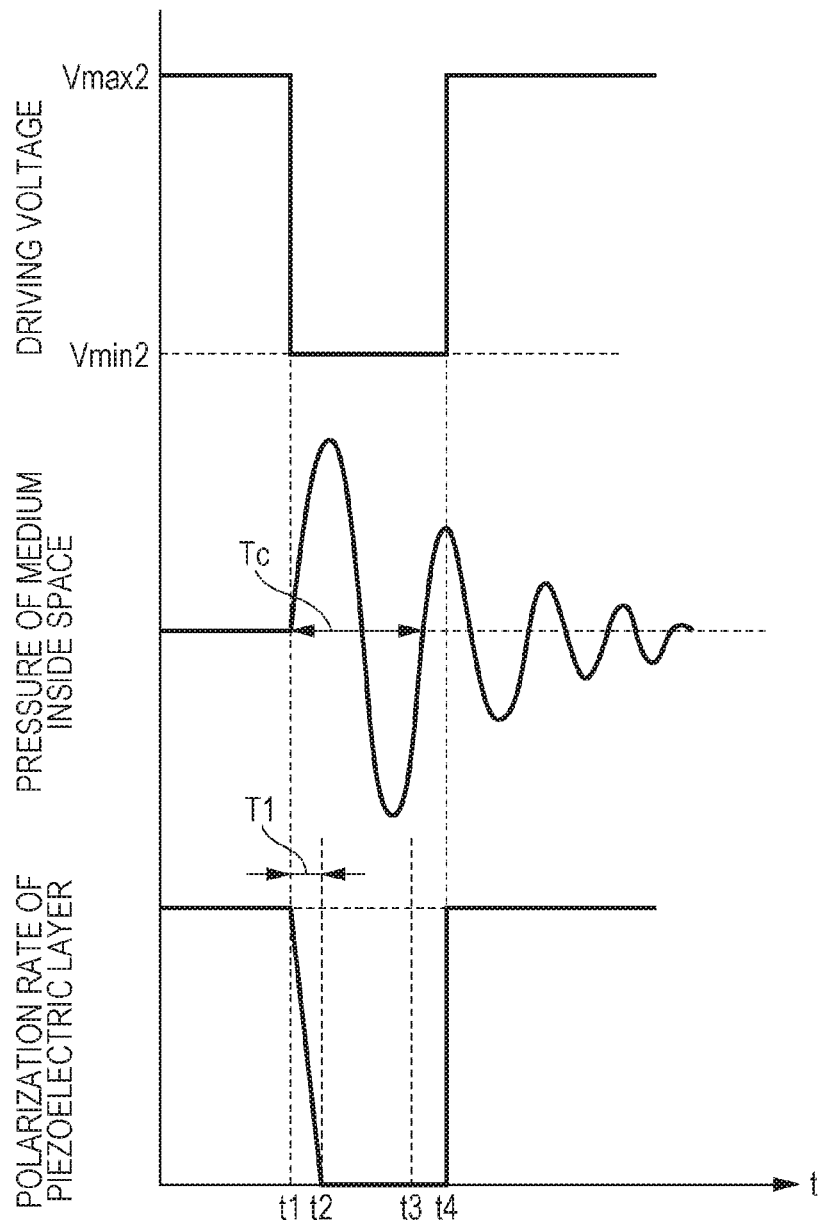
FIG. 6 is a diagram illustrating the relationship between a driving voltage and a polarization rate, and the like, in the ultrasound sensor.

FIG. 6 is a figure illustrating the relationship between the driving voltage of the second mode (FIG. 5B) during driving of the ultrasound sensor 1, the pressure in the space 12, and the polarization rate of the piezoelectric layer 70. In the drawing, the time points t1 and t2 are the relaxation time T1 of the polarization of the piezoelectric layer 70. The time points t1 to t3 is the repeating transmission period Tc of the ultrasound sensor 1.

At the time point t1, the voltage applied to the piezoelectric element 300 is reduced from the maximum voltage Vmax to the minimum voltage Vmin. In so doing, the volume of the space 12 increases to cause vibrations in the diaphragm 50. Pressure fluctuations occur in the medium in the space 12 at the repeating transmission period Tc according to the vibrations. From the viewpoint of greater pressure fluctuations being caused, it is more advantageous for the volume of the space 12 to be reduced when the pressure of the medium in the space 12 is high. Therefore, the maximum voltage Vmax is again applied to the piezoelectric element 300 later than the time point t3 at which the pressure of the medium in the space 12 begins to relatively increase. In so doing, the volume of the space is reduced. The transmitted ultrasound Us1 is transmitted according to this series of pressure fluctuations.

In FIG. 6, the timing which the maximum voltage Vmax is applied to the piezoelectric element 300 is the time point t4 at which the pressure of the medium in the space 12 attains the maximum value. In so doing, pressure fluctuations easily occur in the medium in the space 12, and the high strength transmitted ultrasound Us1 is easily transmitted.

Here, the relaxation time T1 of the polarization of the piezoelectric layer 70 is the repeating transmission period Tc or less (Tc≥T1). At the time point t2, the polarization of the piezoelectric element 300 displaced in the downwardly convex direction at time point t1 substantially disappears. In so doing, the pressing force applied to the space 12 side is substantially eliminated, and the diaphragm 50 returns to upwardly convex that is the initial position.

Accordingly, the diaphragm 50 returns to upwardly convex at the time point of time point t2 each time when the time point t3 at which the maximum voltage Vmax is able to be again applied to the piezoelectric element 300 is reached. Therefore, it is possible for the diaphragm 50 to be displaced in the downwardly convex direction so as to pass through the region of the diaphragm 50 with high compliance each time the maximum voltage Vmax is applied to the piezoelectric element 300. In so doing, it is possible for large pressure fluctuations to be caused in the medium in the space 12, and as a result, it is possible to achieve improvements in the transmission efficiency of the transmitted ultrasound Us1. It is also possible to achieve improvements in the reception efficiency of the reflected ultrasound Us2 by the amount that it is possible for improvements in the transmission efficiency of the transmitted ultrasound Us1 to be achieved.

The repeating transmission period Tc can be regulated by the volume of the space 12, the rigidity of the diaphragm 50, and the like. A suitable repeating transmission period Tc may be designed, as appropriate, according to the usage or the like of the ultrasound sensor 1. As outlined above, if the piezoelectric layer 70 is configured using the BF-BT-based complex oxide having an $ABO_3$-type perovskite structure, an ultrasound sensor 1 in which the relaxation time T1 of the polarization is the repeating transmission period Tc or less is easily obtained.

Figure 7:
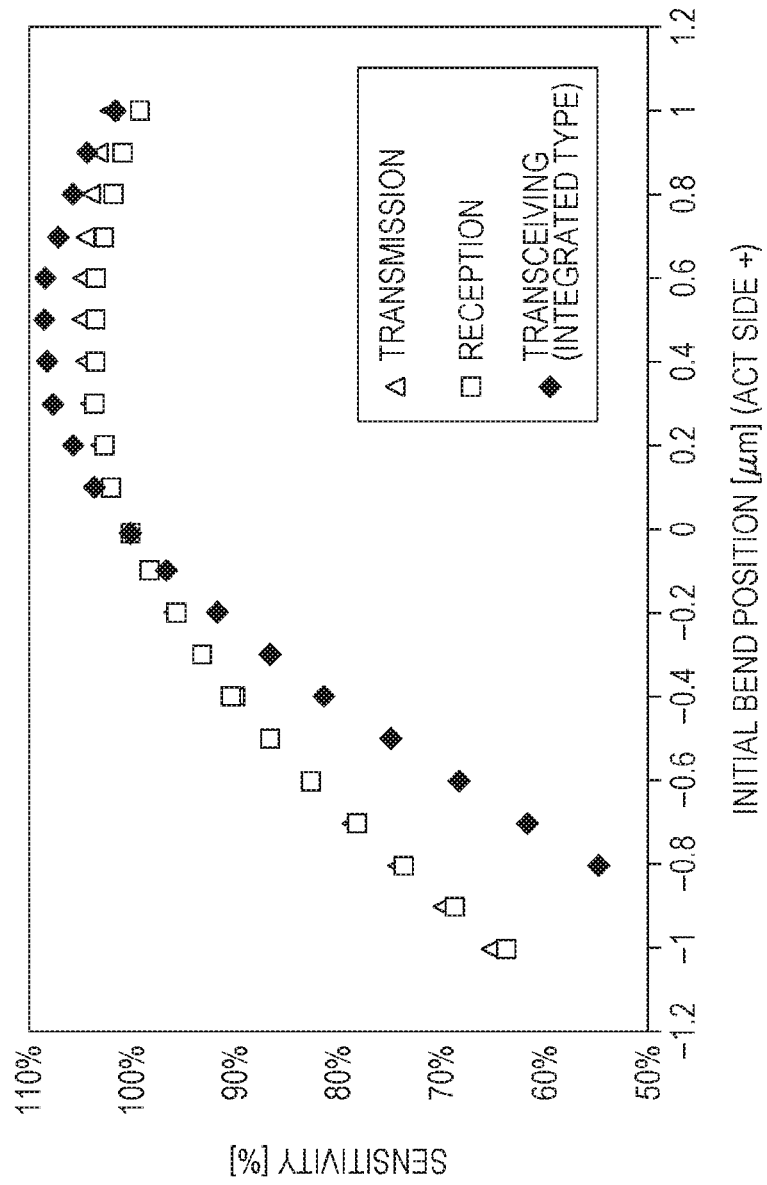
FIG. 7 is a diagram illustrating characteristics of the ultrasound sensor.

FIG. 7 illustrates the ease of displacement for the dedicated transmission-type, dedicated reception-type, and transceiving integrated-type. For any of the dedicated transmission-type, the dedicated reception-type, and the transceiving integrated-type, when the initial position of the diaphragm 50 is at the upward protrusion, it is understood that the compliance increases when the diaphragm is displaced. Moreover, the individual peak position of the detection sensitivity differs slightly for each type. Accordingly, the ultrasound sensor can be designed so as to have a highly efficient detection sensitivity according to the dedicated transmission-type, the dedicated reception-type, and the transceiving integrated-type.

Next, the method of manufacturing the ultrasound sensor 1 will be described. FIGS. 8A to 9B are cross-sectional views illustrating an example of a method of manufacturing the ultrasound sensor 1. First, an elastic film 51 formed from silicon oxide by thermal oxidation or the like is formed on the surface of the substrate 10. Thereafter, an insulating layer 52 formed from zirconium oxide is formed by forming and thermally oxidizing or the like a zirconium film on the elastic film 51. The first electrode 60 is formed on the insulating layer 52 with a sputtering method, a deposition method, and the like, and performing patterning so that the first electrode 60 attains a predetermined shape.

Next, the piezoelectric layer 70 is laminated on the first electrode 60 and the diaphragm 50. It is possible for the piezoelectric layer 70 to be formed using a chemical solution deposition (CSD) method in which a piezoelectric material formed from a metal oxide is obtained by applying and drying a solution in which a metal complex (for example, a metal complex that includes Bi, Ba, Fe, and Ti that forms a BF-BT-based complex oxide) is dissolved and dispersed in a solvent and further fired at a high temperature. The method is not limited to a CSD method, and a sol-gel method, a laser ablation method, a sputtering method a pulse laser deposition method (PLD method), a CVD method, an aerosol deposition method, and the like may be used.

Figure 8A:
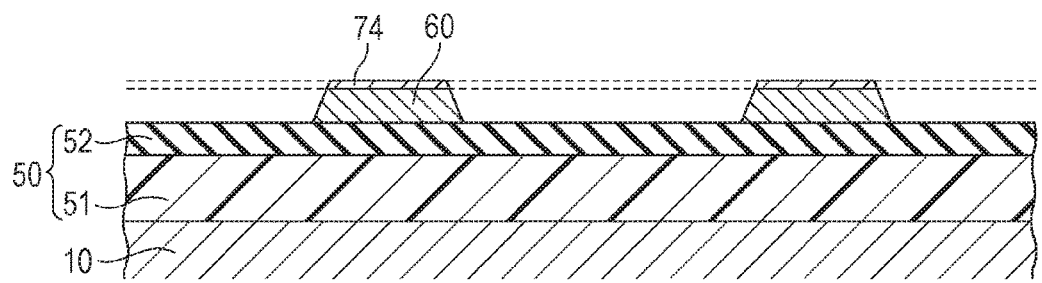
FIGS. 8A to 8C are cross-sectional views illustrating an example of a method of manufacturing an ultrasound sensor.
Figure 8B:
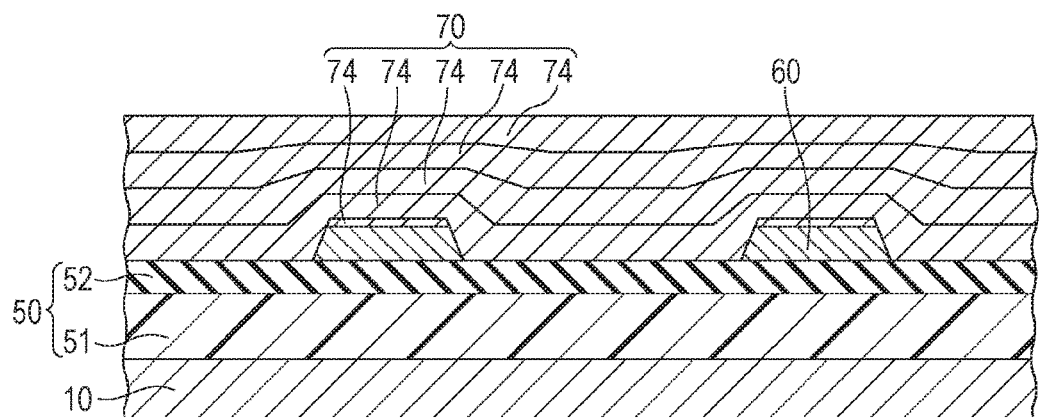
Figure 8C:
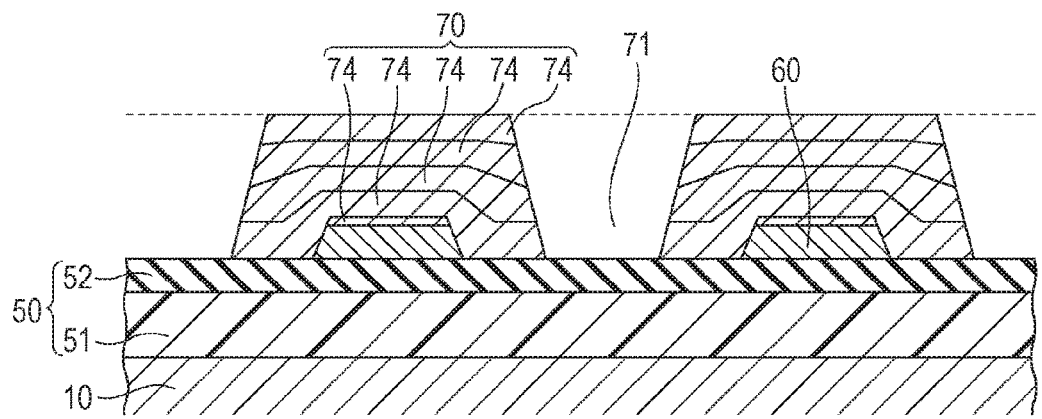

As shown in FIG. 8A, the first electrode 60 and the first layer of the piezoelectric film 74 are patterned at the same time at a step at which the first layer piezoelectric film 74 is formed on the first electrode 60. As shown in FIG. 8B, the piezoelectric layer 70 formed from a plurality of piezoelectric films 74 by layering a second and subsequent layers of the piezoelectric film 74. Naturally, the second and subsequent layers of the piezoelectric film 74 are continuously formed on the diaphragm 50, on the side surfaces of the first electrode 60 and the first layer of the piezoelectric film 74, and on the first layer of the piezoelectric film 74. As further shown in FIG. 8C, the piezoelectric layer 70 is patterned to form a concavity 71 or the like.

Figure 9A:
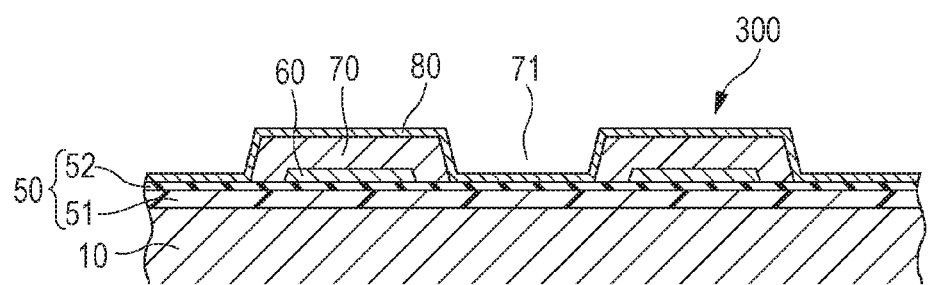
FIGS. 9A and 9B are cross-sectional views illustrating an example of a method of manufacturing an ultrasound sensor.
Figure 9B:
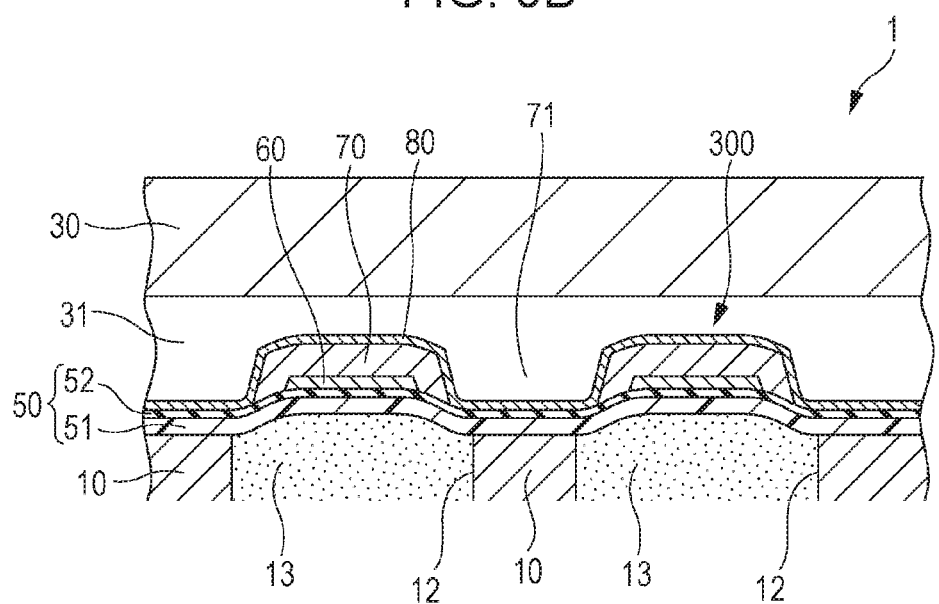

Next, as shown in FIG. 9A, the second electrode 80 is formed and patterned on the side surface of which the piezoelectric layer 70 is patterned, on the diaphragm 50, and on the first electrode 60, and the like. Thereafter, the unnecessary parts are cut and removed by dicing or the like. As shown in FIG. 9B, the acoustic matching layer 13, the enclosure plate 40, and the like shown in FIG. 2 and the like are provided by normal methods and the ultrasound sensor 1 is formed.

Embodiment 2

The embodiment is an ultrasound sensor and a driving method therefor that applies a voltage which causes the polarization direction of the piezoelectric layer to be reversed for each driving period of the ultrasound sensor, and that drives the piezoelectric element. Below, the same members as Embodiment 1 will be given the same reference numerals and will be described centered on the differing parts.

Figure 10:
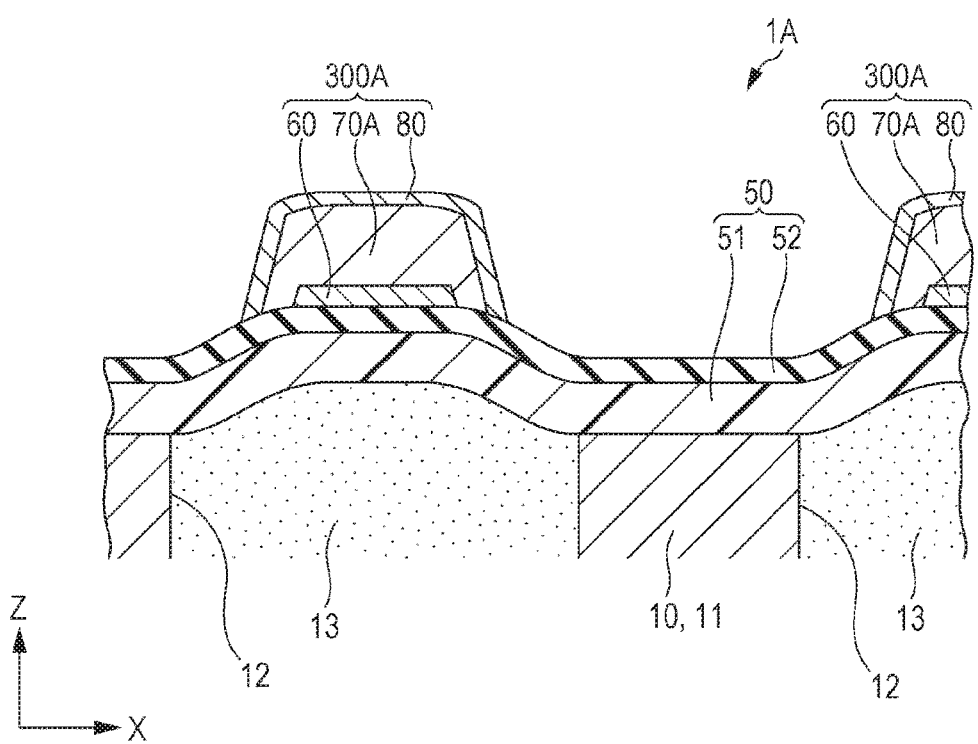
FIG. 10 is cross-sectional view illustrating a configuration example of the ultrasound sensor.

FIG. 10 is cross-sectional view illustrating a configuration example of the substrate, diaphragm, and piezoelectric element of the ultrasound sensor. In the ultrasound sensor 1A, the piezoelectric layer 70A is configured centered on a complex oxide other than BF-BT based. If the complex oxide other than BF-BT based is compared to the BF-BT-based complex oxide, it is difficult to configure the piezoelectric layer (refer to Embodiment 1) in which the relaxation time T1 of the polarization is the repeating transmission period Tc or less. Meanwhile, a piezoelectric layer in which the relaxation time T1 of the polarization exceeds the repeating transmission period Tc is also usable in the ultrasound sensor 1A. That is, the degree of freedom in selecting the material of the piezoelectric layer is high in the ultrasound sensor 1A compared to Embodiment 1. Naturally, a piezoelectric layer in which the relaxation time T1 of the polarization is the repeating transmission period Tc or less is also usable in the ultrasound sensor 1A.

Here, the piezoelectric layer 70A is configured centered on the KNN-based complex oxide. Examples of the piezoelectric layer 70A formed from the KNN-based complex oxide are as described in Embodiment 1. Other elements may be included in the KNN-based complex oxide. Examples of the other element include bismuth (Bi), barium (Ba), calcium (Ca), strontium (Sr), sodium (Na), lithium (Li), samarium (Sm), or cerium (Ce) substituted for a portion of the A site of the piezoelectric layer 70, or iron (Fe), titanium (Ti), manganese (Mn), zinc (Zn), zirconium (Zr), magnesium (Mg), copper (Cu), aluminum (Al), nickel (Ni), cobalt (Co), or chromium (Cr) substituted for a portion of the B site. Although it is preferable that the KNN-based complex oxide does not contain lead, Pb (lead) substituted for a portion of the A site may be included.

Figure 11A:
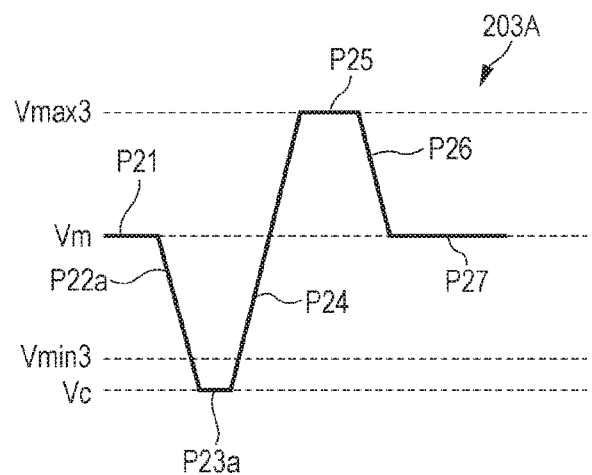
FIGS. 11A and 11B are diagrams illustrating a driving method of an ultrasound sensor.
Figure 11B:
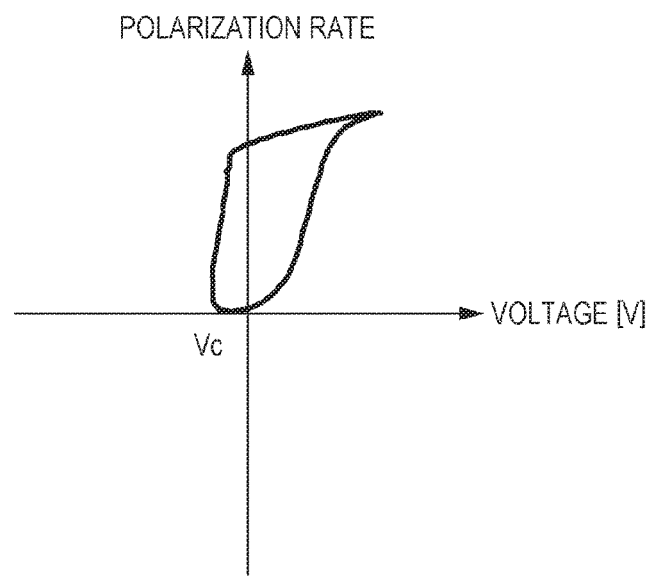

FIGS. 11A and 11B are diagrams illustrating the driving method of the ultrasound sensor. FIG. 11A illustrates an example of the voltage waveform which causes the polarization of the piezoelectric layer to be reversed for each driving period, and FIG. 11B is a drawing illustrating the relationship between the voltage and the polarization rate.

The driving waveform 203A differs from the driving waveform 203 in FIG. 5C of Embodiment 1 on the feature of having a step P22a in which the driving potential is lowered to the coercive voltage Vc, and a step P23a in which the coercive voltage Vc is maintained for a fixed time before the compression step P24 in which the driving potential is raised to the maximum voltage Vmax3. The period of the driving waveform 203A corresponds to the driving period Tw of the ultrasound sensor 1A. The transmitted ultrasound Us1 is transmitted from the ultrasound sensor 1A at the predetermined interval W by the driving waveform 203A being input to the piezoelectric element 300A at the predetermined driving period Tw.

When the hysteresis loop (vertical axis is polarization, and horizontal axis is voltage) of the piezoelectric layer 70A is evaluated, the voltage at which the polarization of the piezoelectric layer 70A is zero is the coercive voltage Vc. Accordingly, it is possible for the driving waveform 203A to forcibly set the polarization of the piezoelectric layer 70A to value close to zero with the steps P22a and P23a. When the polarization of the piezoelectric layer 70A is a value close to zero, the pressing force applied to the space 12 side is substantially eliminated, and the diaphragm 50 returns to upwardly convex that is the initial position.

Here, the voltage which causes the polarization direction of the piezoelectric layer 70A to be reversed for each driving period Tw corresponds to the coercive voltage Vc. It is preferable to use a voltage (the coercive voltage Vc plus or minus approximately 3v) in the vicinity of the coercive voltage Vc as the voltage which causes the polarization direction of the piezoelectric layer 70A to be reversed. Thereby, the polarization of the piezoelectric layer 70A may be reliably reduced.

Figure 12:
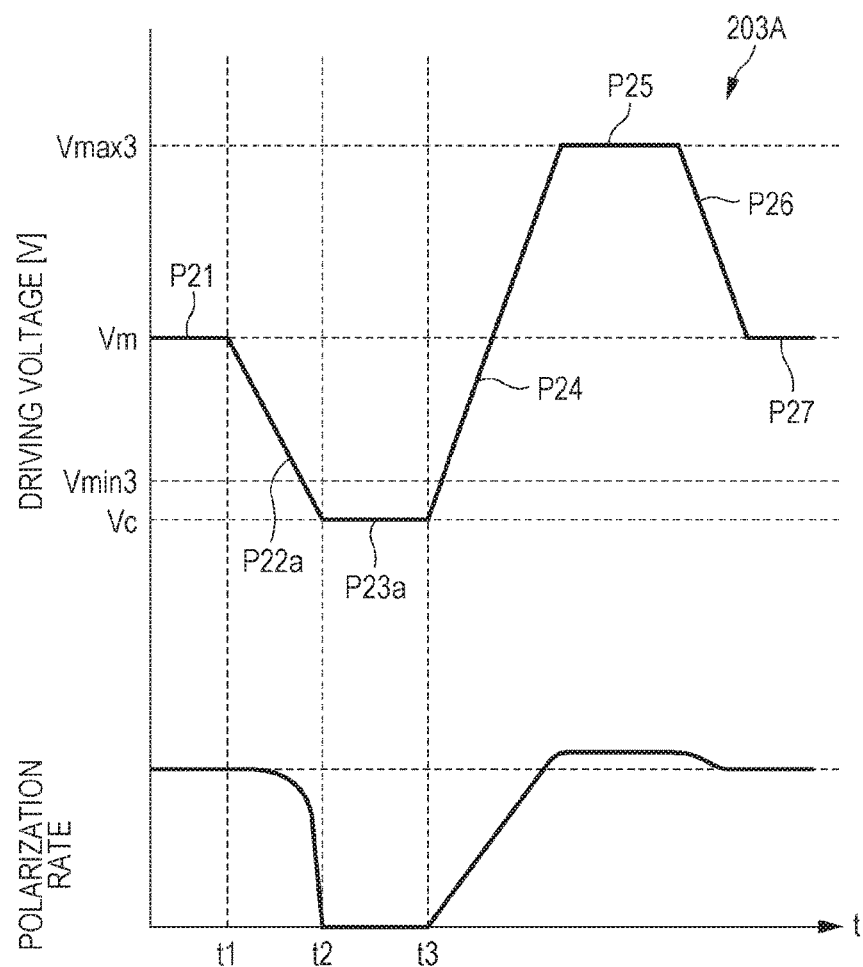
FIG. 12 is a diagram illustrating a driving method of an ultrasound sensor.

FIG. 12 is a timing chart illustrating the relationship between changes in the driving voltage V and the polarization rate P of the piezoelectric layer 70 during driving of the ultrasound sensor 1A. Each step P21 to P27 of the driving waveform 203A in the FIG. 12 corresponds to each step in FIG. 11A.

Subsequent to the time point t1, the driving voltage is reduced from the intermediate voltage Vm, and at the time point t2 is reduced to the coercive voltage Vc. At this time, the polarization of the piezoelectric layer 70A is a value approaching zero. In so doing, the pressing force applied to the space 12 side is substantially eliminated, and the diaphragm 50 returns to upwardly convex that is the initial position.

In the driving waveform 203A, the period Ta at the time periods t2 and t3 and the coercive voltage Vc are held. The diaphragm 50 returns to upwardly convex when the compression step P24 of time period t3 or later is reached. In the expansion step P24, the piezoelectric element 300A is displaced in the direction in which the volume of the space is reduced to vibrate the diaphragm 50. In so doing, pressure fluctuations occur in the medium in the space 12, and the transmitted ultrasound Us1 is transmitted.

In the driving waveform 203A, the diaphragm 50 is forcibly returned to upwardly convex that is the initial position by applying a voltage which causes the polarization direction of the piezoelectric layer 70A to be reversed. Therefore, as outlined above, a piezoelectric layer in which the relaxation time T1 of the polarization exceeds the repeating transmission period Tc is also usable in the ultrasound sensor 1A.

Subsequently, in the ultrasound sensor 1A, a voltage in the vicinity (plus or minus 3v) of the coercive voltage Vc by which the polarization of the piezoelectric layer 70A is reversed is applied for each driving period (steps P21 to P27). The transmitted ultrasound Us1 is transmitted from the ultrasound sensor 1A at the predetermined interval W by the driving waveform 203A being input to the piezoelectric element 300A at the predetermined driving period Tw.

The manufacturing method is basically the same as that in Embodiment 1. The control parts, such as the driving circuit, may be configured so that the voltage which causes the polarization direction of the piezoelectric layer 70A to be reversed is applied for each driving period Tw of the ultrasound sensor 1A.

Other Embodiments

Below, an embodiment of the invention will be described. However, the basic configuration of the invention is not limited to the above aspects.

Figure 13:
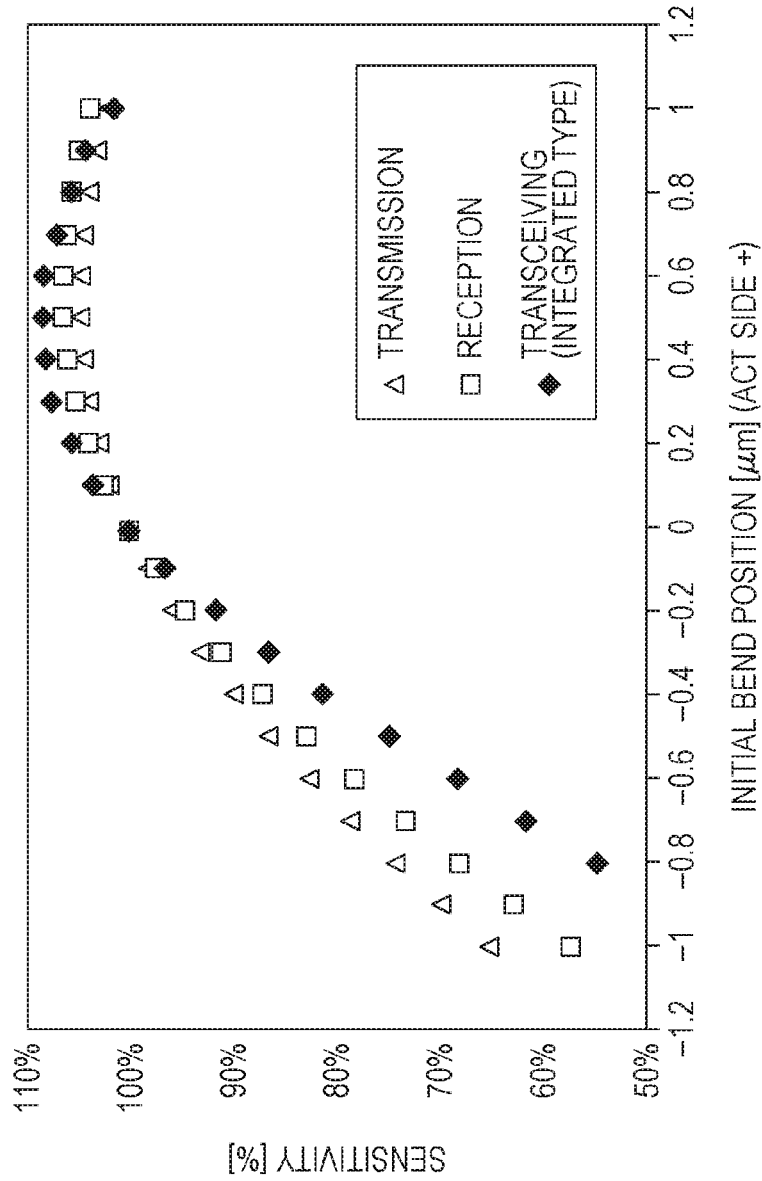
FIG. 13 is a diagram illustrating characteristics of the ultrasound sensor.

FIG. 13 is a diagram illustrating characteristics of the ultrasound sensor. FIG. 13 is an example of a case where the space 12 has rectangular shape (a ratio of the lengths in the first direction X and the second direction Y of 1:10) when seen from the third direction Z.

For any of the dedicated transmission-type, the dedicated reception-type, and the transceiving integrated-type, when the initial position of the diaphragm 50 is at the upward protrusion, it is understood that the compliance increases when the diaphragm is displaced. Moreover, the individual peak position of the detection sensitivity differs slightly for each type. Accordingly, the ultrasound sensor can be designed so as to have a highly efficient detection sensitivity according to the dedicated transmission-type, the dedicated reception-type, and the transceiving integrated-type. In light of this, it is apparent that the shape of the space 12 in the invention can be variously modified.

Figure 14:
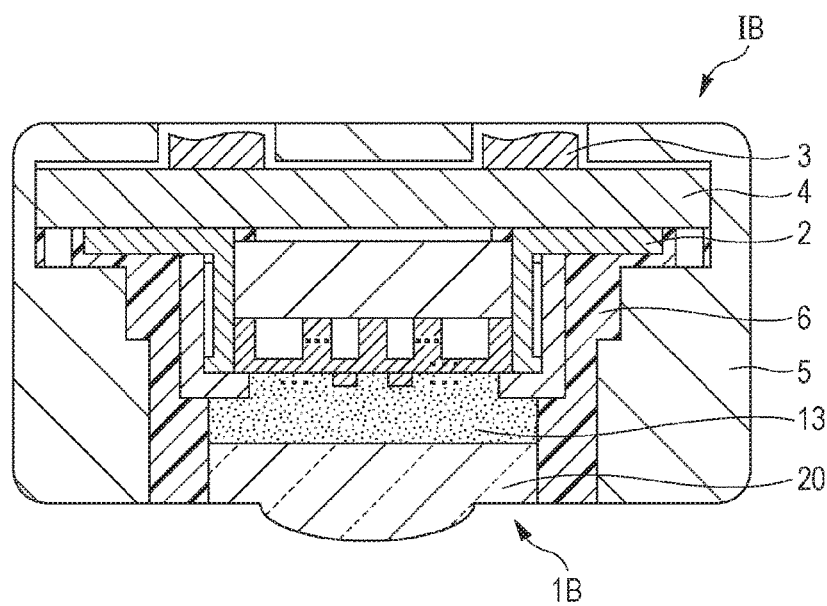
FIG. 14 is a diagram illustrating a schematic configuration of an ultrasound device.

FIG. 14 is a diagram illustrating a schematic configuration of the ultrasound device. In FIG. 14, the ultrasound probe IB is configured so as to include an ACT plane-type ultrasound sensor 1B. In the ACT plane-type ultrasound sensor 1B, the acoustic matching layer 13 is provided on the periphery of the piezoelectric element 300. The diaphragm 50 includes a bend in which a region corresponding to the space 12 becomes upwardly convex to the acoustic matching layer 13 side in a state where a voltage is not applied to the piezoelectric element 300. In the ACT plane-type ultrasound sensor 1B, the inside the space 12 is formed as an air layer.

By the piezoelectric element 300 and the diaphragm being displaced while applying a voltage to the piezoelectric element 300, pressure fluctuations occur in the medium (air layer) in the space 12, and the transmitted ultrasound Us1 is thereby transmitted. When pressure fluctuations occur in the medium in the space while receiving reflected ultrasound Us2, the piezoelectric element 300 and the diaphragm 50 are displaced and a voltage is thereby obtained from the piezoelectric element 300.

Above, in the embodiments, a piezoelectric layer using a complex oxide not containing lead was described. However, the piezoelectric layer may be configured using a complex oxide that contains lead. Examples of the material that configures the piezoelectric layer including lead include ferroelectric materials such as lead zirconate titanate (PZT), or materials to which a metal oxide such as niobium oxide, niobium oxide, magnesium oxide, and lanthanum oxide is added. Specifically, examples include lead zirconate titanate (Pb(Zr, Ti)$O_3$), barium zirconate titanate (Ba(Zr, Ti)$O_3$), lanthanum titanate zirconate ((Pb, La)(Zr, Ti)$O_3$) or lead zirconium titanate magnesium niobate (Pb(Zr, Ti) (Mg, Nb)$O_3$).

It is possible for the ultrasound sensor of the invention to be used as various pressure sensors. The ultrasound sensor is also applicable as a sensor that detects the pressure of ink in a liquid ejecting apparatus such as a printer. It is possible for the constitution of the ultrasound sensor of the invention to be favorably applied to an ultrasound motor, a piezoelectric transformer, a vibration-type dust removal device, an electrical pressure transducer, an ultrasound transmitter, an acceleration sensor. The completed body obtained utilizing the configuration of these types of ultrasound sensor is also included ultrasound devices such as a robot equipped with the ultrasound sensor.

The constituent elements shown in the drawings, that is, the size or shape of each portions, the thickness of the layers, the relative positional relationships, the repeating units, and the like may be shown exaggerated for describing the invention. The wording "above" in the specification is not limited to a position relationship between constituent elements of being "directly above". The expressions "first electrode on the substrate" or "piezoelectric layer on the first electrode" do not exclude other constituent elements between the substrate and the first electrode or between the first electrode and the piezoelectric layer.

The entire disclosure of Japanese Patent Application No. 2015-061754, filed Mar. 24, 2015 is expressly incorporated by reference herein.

What is claimed is:

1. An ultrasound sensor, comprising:
a substrate in which a through hole is formed;
a diaphragm provided on the substrate so as to cover an opening of the through hole, a space being formed by the through hole and the diaphragm in the substrate;
a piezoelectric element which is provided on the diaphragm, the piezoelectric element being located at an opposite side from the substrate with respect to the diaphragm, the piezoelectric element being configured with a first electrode, a piezoelectric layer, and a second electrode; and
an acoustic matching layer provided in the space, the acoustic matching layer being made of a non-gas material, the acoustic matching layer being configured to transfer pressure fluctuation,
wherein the diaphragm is configured to be deformed at a region corresponding to the space toward the piezoelectric element as an initial position when a voltage is not applied to the piezoelectric element, and the diaphragm in the initial position has a first apparent rigidity value,
the diaphragm is configured to be deformed at the region toward the substrate as an operation position when the voltage is applied to the piezoelectric element, and the diaphragm in the operation position has a second apparent rigidity value, and
when the diaphragm is located at an intermediate position between the initial position and the operation position in a cross-sectional view, the diaphragm has a minimum apparent rigidity value that is smaller than the first and second apparent rigidity values.

2. The ultrasound sensor according to claim 1,
wherein the piezoelectric layer is configured from a complex oxide having an AB$O_3$-type perovskite structure that includes bismuth (Bi), iron (Fe), barium (Ba), and titanium (Ti).

3. The ultrasound sensor according to claim 1,
wherein the piezoelectric layer is configured from a complex oxide having a mixed crystal AB$O_3$-type perovskite structure of bismuth ferrate and barium titanate.

4. The ultrasound sensor according to claim 1,
wherein the diaphragm is configured to be deformed at a region corresponding to the acoustic matching layer toward the piezoelectric element when the voltage is not applied to the piezoelectric element.

5. The ultrasound sensor according to claim 1,
wherein the acoustic matching layer is provided on a periphery of the piezoelectric element.

* * * * *